US008917210B2

(12) United States Patent
Dang et al.

(10) Patent No.: US 8,917,210 B2
(45) Date of Patent: Dec. 23, 2014

(54) PACKAGE STRUCTURES TO IMPROVE ON-CHIP ANTENNA PERFORMANCE

(71) Applicant: International Business Machines Corporation, Armonk, NY (US)

(72) Inventors: Bing Dang, Chappaqua, NY (US); Duixian Liu, Scarsdale, NY (US); Loïc Marnat, Fléac (FR); Atif Shamim, Thuwal (FR); Cornelia K.-I. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 13/686,377

(22) Filed: Nov. 27, 2012

(65) Prior Publication Data

US 2014/0145884 A1     May 29, 2014

(51) Int. Cl.
*H01Q 1/38*     (2006.01)

(52) U.S. Cl.
CPC ........................... *H01Q 1/38* (2013.01)
USPC .................................................. 343/700 MS

(58) Field of Classification Search
USPC .................................................. 343/700 MS
See application file for complete search history.

(56) References Cited

U.S. PATENT DOCUMENTS

| 8,384,596 | B2 * | 2/2013 | Rofougaran et al. ... | 343/700 MS |
| 2004/0090370 | A1 * | 5/2004 | McCarrick ............. | 343/700 MS |
| 2009/0251362 | A1 | 10/2009 | Margomenos et al. | |
| 2009/0273517 | A1 | 11/2009 | Thiesen et al. | |
| 2010/0052975 | A1 | 3/2010 | Milano et al. | |
| 2012/0235881 | A1 | 9/2012 | Pan et al. | |
| 2013/0021208 | A1 * | 1/2013 | Seok et al. ............ | 343/700 MS |

FOREIGN PATENT DOCUMENTS

| EP | 1858162 A1 | 11/2007 |
| GB | 2467325 A | 8/2010 |
| KR | 20070016691 A | 2/2007 |

OTHER PUBLICATIONS

C. Chansungsan et al., "Method for an On-Chip RF CMOS Global Clock Transmitter and Receiver," IP.com Prior Art Database, IPCOM000009611D, Sep. 2002, 5 pages.

A.M. Hashim et al., "Dual-Functional On-Chip AlGaAs/GaAs Schottky Diode for RF Power Detection and Low-Power Rectenna Applications," Sensors, 2011, pp. 8127-8142, vol. 11, No. 8, Molecular Diversity Preservation International.

(Continued)

*Primary Examiner* — Dieu H Duong
(74) *Attorney, Agent, or Firm* — Anne V. Dougherty; Ryan, Mason & Lewis, LLP

(57) ABSTRACT

A radio frequency integrated circuit (RFIC) chip package is provided having an RFIC chip and an integrated antenna structure. The integrated antenna structure includes an on-chip antenna having one or more radiator elements formed as part of a back-end-of-line structure of the RFIC chip. The antenna structure further includes a superstrate structure disposed on the back-end-of-line structure of the RFIC chip. The superstrate structure includes at least one substrate layer and a focusing metal element. The focusing metal element has a structure that is complementary to the on-chip radiator elements and which is configured to focus electromagnetic radiation to and from the planar antenna structure. The superstrate structure improves the performance (e.g., antenna gain and bandwidth) of the on-chip antennas for millimeter-wave applications.

30 Claims, 6 Drawing Sheets

(56) References Cited

OTHER PUBLICATIONS

A. Babakhani et al., "A 77-GHz Phased-Array Transceiver with On-Chip Antennas in Silicon: Receiver and Antennas," IEEE Journal of Solid-State Circuits, Dec. 2006, pp. 2795-2806, vol. 41, No. 12.

J.M. Edwards et al., "High-Efficiency Elliptical Slot Antennas with Quartz Superstrates for Silicon RFICs," IEEE Transactions on Antennas and Propagation, Jan. 2012, pp. 1-11.

Y.-C. Ou et al., "Differential Microstrip and Slot-Ring Antennas for Millimeter-Wave Silicon Systems," IEEE Transactions on Antennas and Propagation, Jun. 2012, pp. 2611-2619, vol. 60, No. 6.

* cited by examiner

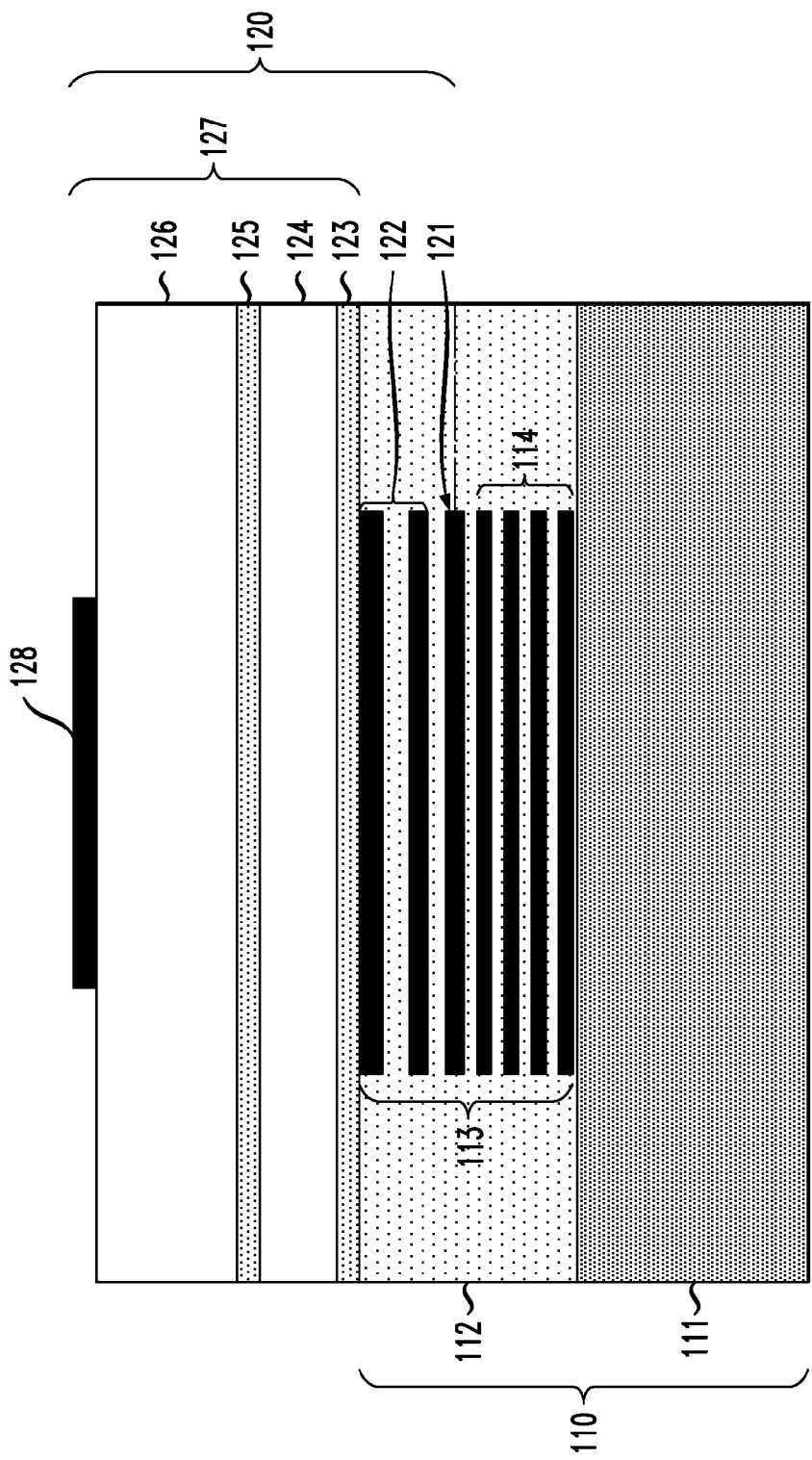

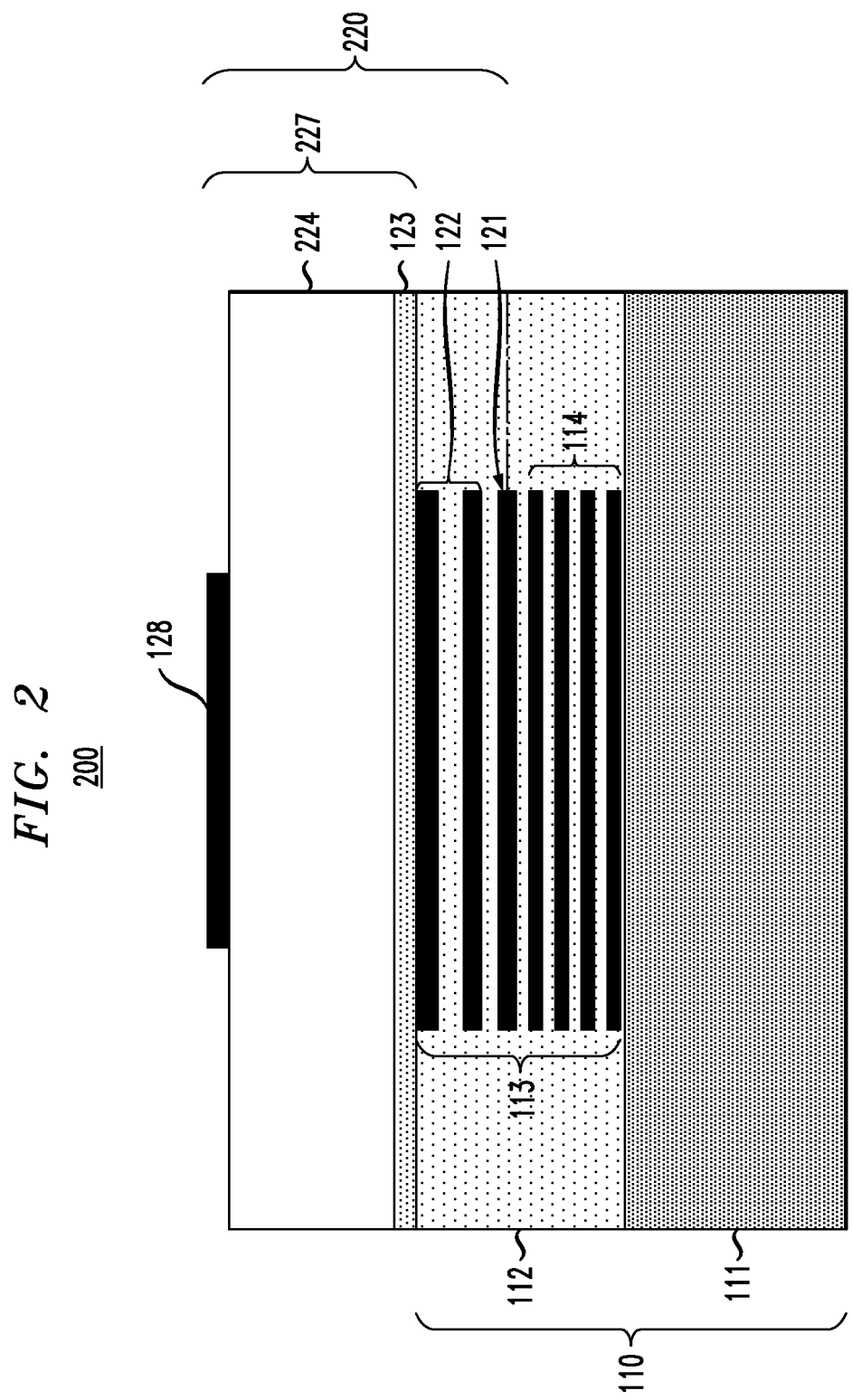

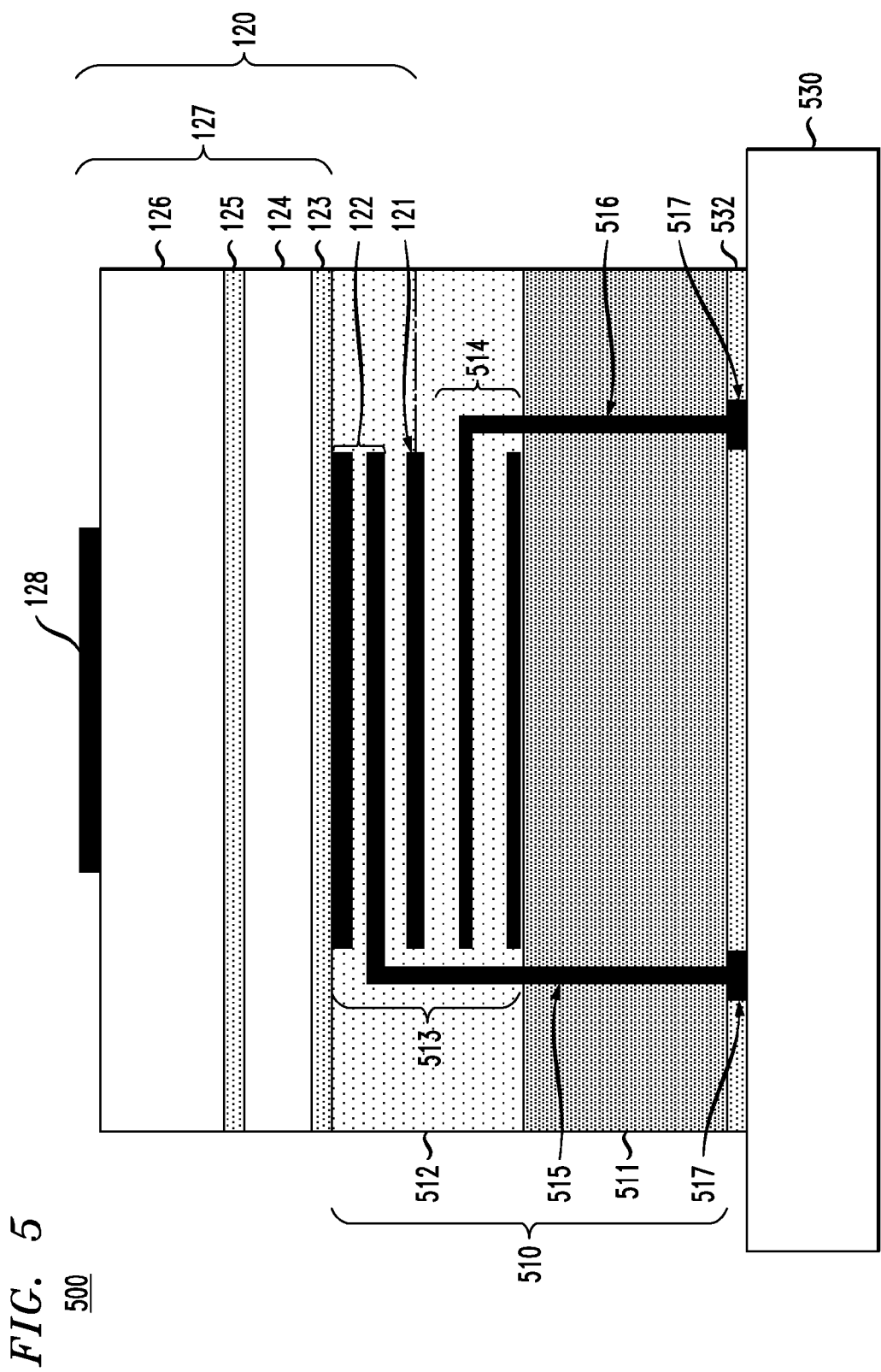

600

US 8,917,210 B2

PACKAGE STRUCTURES TO IMPROVE ON-CHIP ANTENNA PERFORMANCE

TECHNICAL FIELD

The field generally relates to RFIC (radio frequency integrated circuit) chip packages with integrated antennas and, in particular, packaging structures and methods to improve antenna performance (e.g., antenna gain and bandwidth) in millimeter-wave applications for on-chip antennas that are integrally formed as part of BEOL (back-end-of-line) structures of RFIC chips.

BACKGROUND

Antennas are used in various RF (radio frequency) systems. For frequencies up to 60 GHz, antennas are typically designed separately from RFIC chips, and then packaged with the RFIC chips using various techniques. For instance, in millimeter-wave frequencies at 60 GHz up to 94 GHz, an antenna structure can be integrated into an RFIC chip package (antenna-in-package design) by connecting the antenna structure to the RFIC chip using flip-chip bonding or wire bonding techniques, which can improve antenna performance. In particular, with some state of the art technologies, multilayer integrated antenna structures can be fabricated using multilayered printed circuit boards (PCB) (organic-based) or using low temperature co-fired ceramic (LTCC) technology (ceramic-based). These multilayered organic or ceramic integrated antenna structures can be connected to semiconductor IC chips using standard C4 (controlled collapse chip connection) techniques.

Integrated antenna structures that are made with organic or ceramic-based packaging techniques are generally suitable for application operating frequencies in the 60 GHz band while achieving suitable performance. However, for operating frequencies in the 94 GHz band and above, the use of organic or ceramic-based multilayer antenna structures becomes problematic due to, e.g., low PCB and LTCC manufacturing tolerances and resolutions. Moreover, the package materials used for PCB and LTCC technologies are too lossy for such high frequency applications. Moreover, with antenna-in-package designs, the interface (typically flip-chip connection) between the antenna package and the RFIC chip can result in more than 1 dB signal attenuation at 94 GHz, diminishing the advantages of antenna-in-package designs. Thus, it is desirable to design package structures with integrated antennas, which provide high performance for applications with operating frequencies in the 94 GHz band and higher.

SUMMARY

In general, exemplary embodiments of the invention include RFIC chip packages with integrated antennas and, in particular, packaging structures and methods to improve antenna performance (e.g., antenna gain and bandwidth) in millimeter-wave applications for on-chip antennas that are integrally formed as part of BEOL structures of RFIC chips.

In one embodiment of the invention, a package structure includes an RFIC (radio frequency integrated circuit) chip and an antenna structure. The RFIC chip includes a semiconductor substrate having an active surface and an inactive surface, and a BEOL structure formed on the active surface of the semiconductor substrate. The antenna structure includes a planar antenna and a superstrate structure. The planar antenna includes one or more radiator elements formed as part of the BEOL structure of the RFIC chip. The superstrate structure is disposed on a surface of the BEOL structure adjacent planar antenna. The superstrate structure includes at least one substrate layer and a focusing metal element which is disposed on a surface of the at least one substrate and aligned to the one or more radiator elements of the planar antenna. The focusing metal element has a structure that is complementary to the one or more radiator elements of the planar antenna and which is configured to focus electromagnetic radiation to and from the planar antenna structure.

These and other exemplary embodiments, aspects, and features of the present invention will be described or become apparent from the following detailed description of exemplary embodiments, which is to be read in connection with the accompanying drawings.

BRIEF DESCRIPTION OF THE DRAWINGS

FIG. 1 schematically depicts an RFIC package comprising an integrated antenna structure according to an embodiment of the invention.

FIG. 2 schematically depicts an RFIC package comprising an integrated antenna structure according to another embodiment of the invention.

FIG. 5 schematically depicts an RFIC package comprising an integrated antenna structure according to another embodiment of the invention.

DETAILED DESCRIPTION

Figure 3B:
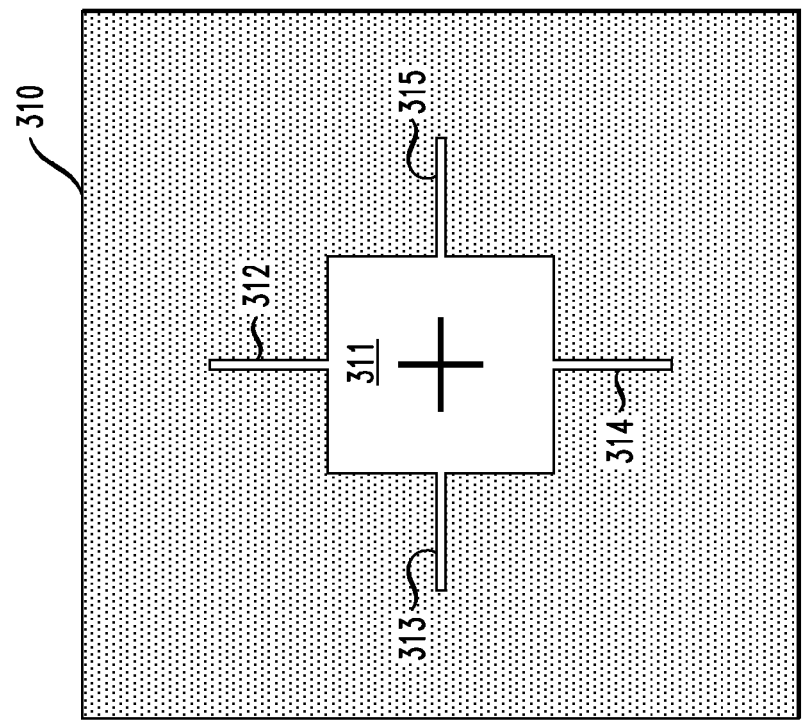
FIGS. 3A and 3B illustrate a planar patch antenna and a complementary focusing metal element, respectively, which can be used to construct an RFIC package with an integrated antenna structure, according to an embodiment of the invention.

Embodiments of the invention will now be discussed in further detail with regard to packaging structures and methods to improve antenna performance (e.g., antenna gain and bandwidth) in millimeter-wave applications (e.g., 94 GHz) for on-chip antennas that are integrally formed as part of BEOL structures of RFIC chips. In general, embodiments of the invention as shown in the accompanying drawings include package structures having an antenna structure comprising a planar on-chip antenna, wherein the on-chip antenna comprises one or more planar radiator elements formed as part of a BEOL structure of an RFIC chip. The antenna structure further comprises a superstrate structure disposed on the BEOL structure of the RFIC chip. The superstrate structure includes at least one substrate layer and a focusing metal element. The focusing metal element has a structure that is complementary to the on-chip radiator elements, and the focusing metal element is configured to focus electromagnetic radiation to and from the planar on-chip antenna. The superstrate structure improves the performance (e.g., antenna gain and bandwidth) of the on-chip antenna for millimeter-wave applications.

It is to be understood that the various layers and/or regions shown in the accompanying drawings are not drawn to scale, and that one or more layers and/or regions of a type commonly used in integrated chip packages may not be explicitly shown in a given drawing. This does not imply that the layers and/or regions not explicitly shown are omitted from the actual integrated chip packages. Moreover, the same or similar reference numbers used throughout the drawings are used to denote the same or similar features, elements, or structures, and thus, a detailed explanation of the same or similar features, elements, or structures will not be repeated for each of the drawings.

FIG. 1 schematically depicts an RFIC package comprising an integrated antenna structure according to an embodiment of the invention. In particular, FIG. 1 is a schematic side view of a package structure 100 comprising an RFIC chip 110 and an antenna structure 120 integrally formed on an active side of the RFIC chip 110. The RFIC chip 110 comprises a semiconductor substrate 111 (e.g., silicon substrate) and a BEOL structure 112 formed on an active surface of the semiconductor substrate 111. The BEOL structure 112 comprises a plurality of alternating dielectric/insulating layers and patterned metallic layers 113. The dielectric/insulating layers may be formed of materials such as silicon dioxide, and the patterned metallic layers may be formed of materials such as copper, gold, aluminum, or other known dielectric, insulating, metallic or conductor materials, which are commonly used to construct BEOL structures in wafer scale manufacturing.

The semiconductor substrate 111 comprises active circuit elements that form various circuits, such as a receiver, a transmitter, or a transceiver circuit, for example, as well as other types of active or passive circuit elements that are commonly used to implement wireless RFIC chips. The BEOL insulating and metal layers 113 comprise a plurality of lower metal layers 114 which form an interconnect fabric for connecting the various active and passive circuit components in the active surface of the semiconductor substrate 111. Although a generic interconnection fabric is shown in FIG. 1, the lower metal layers 114 may comprise various patterned structures including, horizontal wiring, vertical interconnects, vias, contact pads, and other passive components such as distributed inductor and capacitor elements, etc. which are commonly used for constructing BEOL interconnection networks.

The BEOL insulating and metal layers 113 further comprise a plurality of upper metal layers 121 and 122 that form various on-chip antenna components of the antenna structure 120. For instance, the upper layers of the BEOL layers 113 include for example, an antenna ground plane 121 and two or more patterned metal layers 122 that form antenna feed line structures and planar radiator elements. In this regard, the metal layers 121 and 122 form an on-chip antenna structure that is fabricated part of the BEOL structure 112 of the RFIC chip 110. Although the on-chip antenna structure is generically depicted by the patterned metal layers 121 and 122 shown in FIG. 1, it is to be understood that the various antenna components formed by the patterned metal layers 122 may include one or more of various types of planar antenna radiator elements such as patch antennas, stacked patch antennas, electromagnetically-coupled patch antennas, slot antennas, ring antennas, fractal patch antennas, dipole antennas, loop antennas, and other types of planar antenna radiator elements known by those of ordinary skill in the art. Moreover, an antenna feed line may be a differential feed line, a micro strip line, or a co-planar waveguide line, or other types of feed lines that are directly connected to antenna radiator elements or which electromagnetically couple energy to and from antenna radiator elements.

The performance of an on-chip antenna structure formed by the patterned metal layers 121 and 122 of the BEOL structure 112 alone can be very poor, with the radiation efficiency (gain) of an on-chip antenna undesirably low, e.g., in a range of about −15 dBi to about −3 dBi, depending on the antenna design. Indeed, at millimeter-wave frequencies of 60 GHz and above, on-chip antenna structures are problematic in that these structures can couple substantial RF power into substrate modes of various layers of the semiconductor substrate due to the effective electrical thickness of these layers at such millimeter-wave frequencies. These substrate modes not only increase mutual coupling between the on-chip antenna structure and other on-chip components, but also make the impedance and radiation patterns sensitive to the dimensions of the silicon layers and nearby structures.

Furthermore, the low resistivity (meaning high loss) silicon material dissipates substantial RF power as loss, resulting in very low antenna radiation efficiency. While the antenna ground plane 121, which is disposed between the semiconductor substrate 111 and the patterned metal layers 122 forming the antenna radiator and feed line elements, can provide some isolation from the lossy material forming the semiconductor substrate 111, the thickness of the BEOL oxide layers (which are typically <12 μm thick), can degrade the radiation efficiency and performance of the on-chip antenna radiator elements when the radiator elements are too close the ground plane 121.

To improve the performance of the on-chip antenna structure 121/122, the antenna structure 120 shown in FIG. 1 comprises a superstrate structure 127 disposed on top of the BEOL structure 112. In the embodiment of FIG. 1, the superstrate structure 127 comprises a first substrate layer 124 that is bonded to the top of the BEOL structure 112 by a first adhesive layer 123, a second substrate layer 126 that is bonded to the top of the first substrate layer 124 by a second adhesive layer 125, and a focusing metallic element 128 disposed on top of the second substrate layer 126. The focusing metallic element 128 is aligned to the radiator elements of the on-chip antenna structure 122. It is to be understood term "aligned" means, for example, that the focusing metallic element 128 and an on-chip antenna radiator element either partially overlap or fully overlap each other on the different layers.

FIG. 2 schematically depicts an RFIC package comprising an integrated antenna structure according to another embodiment of the invention. In particular, FIG. 2 is a schematic side view of a package structure 200 comprising an RFIC chip 110 and an antenna structure 220 integrally formed on an active side of the RFIC chip 110. The various components 111, 112, 113, 114, 121, 122, 123, and 128 of the RFIC chip 110 and antenna structure 220 depicted in FIG. 2 are the same or similar in structure and function to the similarly labeled components shown in FIG. 1. As such, a discussion on structural details of these components 111, 112, 113, 114, 121, 123, and 128 will not be repeated. In contrast to the antenna structure 120 shown in FIG. 1, the antenna structure 220 shown in FIG. 2 has superstrate structure 227 that comprises a single substrate layer 224 bonded to the BEOL structure 112 with the focusing element 128 disposed on top of the single substrate layer 224 in alignment with the on-chip antenna structure 122.

In general, the inventors have found through experimentation and construction of experimental prototypes, that the performance of an on-chip antenna can be improved with respect to increased antenna bandwidth and increased antenna gain by using a superstrate structure comprising one or more focusing metallic elements disposed on top of a stack of one or more low-loss substrates, as generally depicted in FIGS. 1 and 2. Unlike a conventional stacked patch antenna comprising first and second radiator elements separated by a dielectric/insulating layer, the focusing metal elements 128 shown in FIGS. 1 and 2 do not function as antenna radiator elements. Instead, the focusing metal elements 128 in FIGS. 1 and 2 are metal elements that are complementary to the radiator elements of the on-chip antennas and serve to focus or otherwise concentrate electromagnetic radiation to and from the on-chip antennas 122 to focus the beam width and increase antenna gain. Moreover, unlike conventional stacked patch antenna structures, the distance between the on-chip antenna radiator elements and the complementary focusing metal elements 128 can vary significantly, resulting in flexibility of the total thickness of the one or substrate layers of the superstrate structures that separate the complementary focusing metal elements 128 and the on-chip radiator elements. For example, in one embodiment of the invention, the distance between the focusing metal element 128 and the on-chip antenna structure 122 can be much less than ¼ wavelength for the given operating frequency.

In one embodiment of the invention, the substrate layers 124, 126, and 224 of the superstrate structures 127 and 227 shown in FIGS. 1 and 2 are formed of low-loss, low dielectric constant materials. For instance, the substrates 124, 126 and 224 may be formed of a low loss semiconductor substrate material such as high resistivity silicon (e.g., >1000 Ohm·cm), silica, quartz, or other materials suitable for wafer-scale manufacturing. The thickness of the various substrate layers 124, 126, and 224 will depend on factors such as the dielectric constant of the material used, the operating frequency, the performance requirements (bandwidth, gain) of the antenna structures, and the commercial availability of substrate materials that are desired for the given package structure design.

For example, in one example embodiment of FIG. 1, for a 94 GHz operating frequency, the first substrate layer 124 is an insulating layer formed of a glass material (e.g., Borofloat) and the second substrate layer 126 is a semiconductor layer formed of high-resistivity silicon. Depending on the dielectric constant of the materials forming the first and second substrate layers 124, 126, the total thickness of the two substrate layers can be in a range of about 50 μm to about 250 μm, wherein the first substrate layer 124 formed of a glass material such as Borofloat can have a thickness in a range of about 50 μm to about 100 μm, and wherein the second substrate layer 126 formed of high-resistivity silicon material can have a thickness in a range of about 50 μm to about 150 μm. Furthermore, in one example embodiment of FIG. 2, for a 94 GHz operating frequency, the single substrate layer 224 can be formed of a low loss, low dielectric material such as glass having a thickness in a range of about 50 μm to about 450 μm.

Figure 3A:
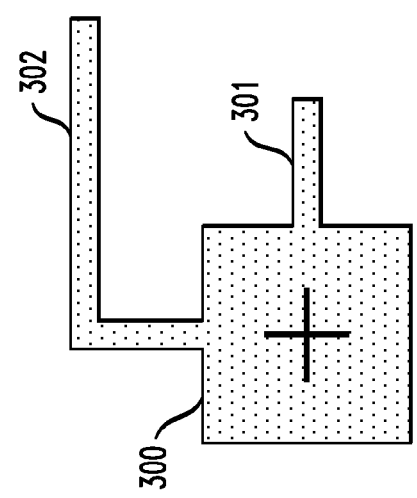

FIGS. 3A and 3B illustrate embodiments of a planar patch antenna and a complementary focusing metal element, respectively, which can be used to construct an antenna structure for an RFIC package, according to an embodiment of the invention. In particular, FIG. 3A schematically illustrates a planar dual-polarized patch antenna 300 with two feed lines 301 and 302, which can be patterned on an upper metal layer of the BEOL layers 122 (as generically depicted in FIGS. 1 and 2) to form an on-chip antenna. Moreover, FIG. 3B schematically illustrates a planar focusing metal element 310 that is complementary to the patch element 300 of FIG. 3A, and which can be used for the focusing metal element 128 generically depicted in FIGS. 1 and 2, for example.

The planar focusing metal element 310 shown in FIG. 3B comprises a square cutout feature 311 in a central region thereof, and a plurality of thin, rectangular notch features 312, 313, 314 and 315 extending out from each side of the square cutout feature 311. The "+" signs depicted in FIGS. 3A and 3B are exemplary alignment markers that illustrate how the planar patch antenna element 300 and the complementary planar focusing metal element 310 are vertically aligned with each other in a package structure. The planar focusing metal element 310 with the central square cutout feature 311 functions as a lens structure that narrows the beam width of the antenna and focuses electromagnetic energy to and from the planar patch antenna element 300, thereby increasing the gain of the antenna structure. The central square cutout feature 311 of the planar focusing metal element 310 is slightly larger in area than the planar patch antenna element 300 of FIG. 3A. The four thin rectangular notches 312, 313, 314 and 315 are used to tune the antenna impedance matching.

Figure 4B:
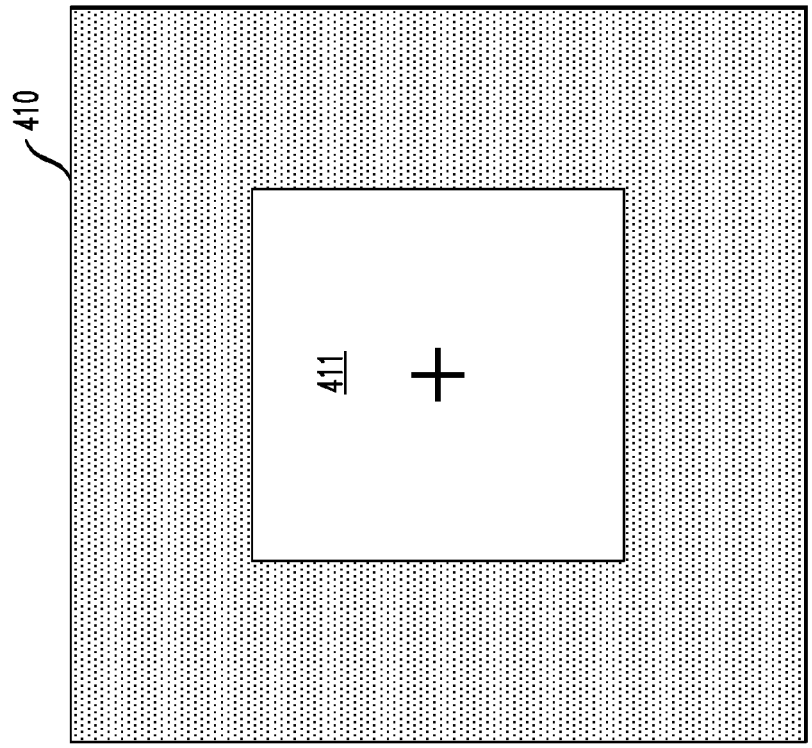
FIGS. 4A and 4B illustrate a fractal patch antenna and a complementary focusing metal element, respectively, which can be used to construct an RFIC package with an integrated antenna structure, according to another embodiment of the invention.
Figure 4A:
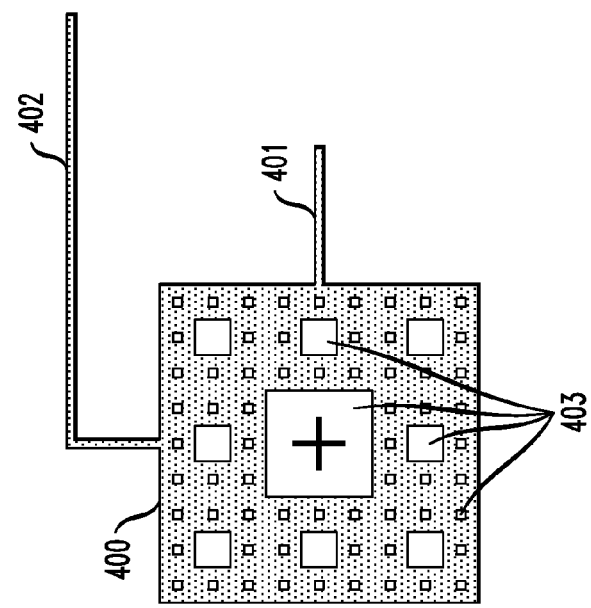

FIGS. 4A and 4B illustrate embodiments of a planar dual-polarized fractal-patch antenna and a complementary focusing metal element, respectively, which can be used to construct an antenna structure for an RFIC package, according to another embodiment of the invention. In particular, FIG. 4A schematically illustrates a planar dual-polarized fractal-patch antenna 400 with two feed lines 401 and 402, which can be patterned on an upper metal layer of the BEOL layers 122 (as generically depicted in FIGS. 1 and 2) to form an on-chip antenna. The planar dual-polarized fractal-patch antenna 400 comprises a pattern of variable size cutout features 403, which enables the fractal patch radiator element 400 to have smaller dimensions than the planar patch element 300 of FIG. 3A, for the same operating frequency (e.g. 94 GHz).

Moreover, FIG. 4B schematically illustrates a planar focusing metal element 410 that is complementary to the planar fractal patch antenna element 400 of FIG. 4A, and which can be used for the focusing metal element 128 generically depicted in FIGS. 1 and 2, for example. The planar focusing metal element 410 shown in FIG. 4B comprises a square cutout feature 411 in a central region thereof. The "+" signs depicted in FIGS. 4A and 4B are exemplary alignment markers that illustrate how the planar fractal patch antenna element 400 and the complementary planar focusing element 410 are vertically aligned with each other in a package structure. The planar focusing metal element 410 with the central square cutout feature 411 functions as a lens structure that narrows the beam width of the antenna and focuses electromagnetic energy to and from the planar fractal patch antenna element 400, thereby increasing the gain of the antenna structure. The central square cutout feature 411 of the planar focusing metal element 410 is larger in area than the planar fractal patch antenna element 400 of FIG. 4A.

FIG. 5 schematically depicts an RFIC package comprising an integrated antenna structure according to another embodiment of the invention, which implements a TSV (Through-Silicon-Via) design. In general, FIG. 5 illustrates an RFIC package structure 500 that implements a TSV process which allows the overall RFIC package structure with an integrated antenna to be wafer-scaled manufactured, and therefore, suitable for 3D integration. In particular, FIG. 5 is a side schematic view of a package structure 500 comprising an RFIC chip 510, an antenna structure 120 integrally formed on an active side of the RFIC chip 510, and an application board 530 on which the RFIC chip 510 is mounted using a BGA (ball grid array) and C4 process. The antenna structure 120 shown in FIG. 5 is similar to the antenna structure 120 shown in FIG. 1, so detailed discussion thereof will not be repeated.

Similar to the RFIC chip 110 shown in FIG. 1, the RFIC chip 510 of FIG. 5 comprises a semiconductor substrate 511 (e.g., silicon substrate) and a BEOL structure 512 formed on an active surface of the semiconductor substrate 511. The BEOL structure 512 comprises a plurality of alternating dielectric/insulating layers and patterned metallic layers 513. The RFIC chip 510 further comprises a plurality of conductive through-silicon-vias 515 and 516, which are formed through the BEOL structure 512 and semiconductor substrate 511, forming vertical interconnects between various patterned metal layers of the BEOL layers 513 to contact pads 517 formed on the backside surface of the semiconductor substrate 511.

For example, the silicon-through via 515 provides an electrical connection between a contact pad 517 on the backside surface of the substrate 511 to one of the patterned metal layers 122 (e.g., antenna feed line) of the on-chip antenna structure. Furthermore, the silicon-through via 516 provides an electrical connection between another contact pad 517 and a patterned metal layer (e.g., power plane, I/O wiring, etc.) of an interconnection network 514 of the BEOL structure 512. The silicon-through vias 515 and 516 allow DC supply, or control or I/O baseband signal connections between the RFIC chip 510 and other chip packages or system components mounted to the application board 530. The contact pads 517 may be bonded to corresponding contacts (not shown) formed on the application board 530 using BGA techniques and solder balls (e.g., C4 connections). An underfill/adhesive layer 532 is used to further bond the backside surface of the substrate 511 to the surface of the application board 530 and reduce mechanical stress on the BGA, C4 connections, using well-known techniques.

Figure 6:
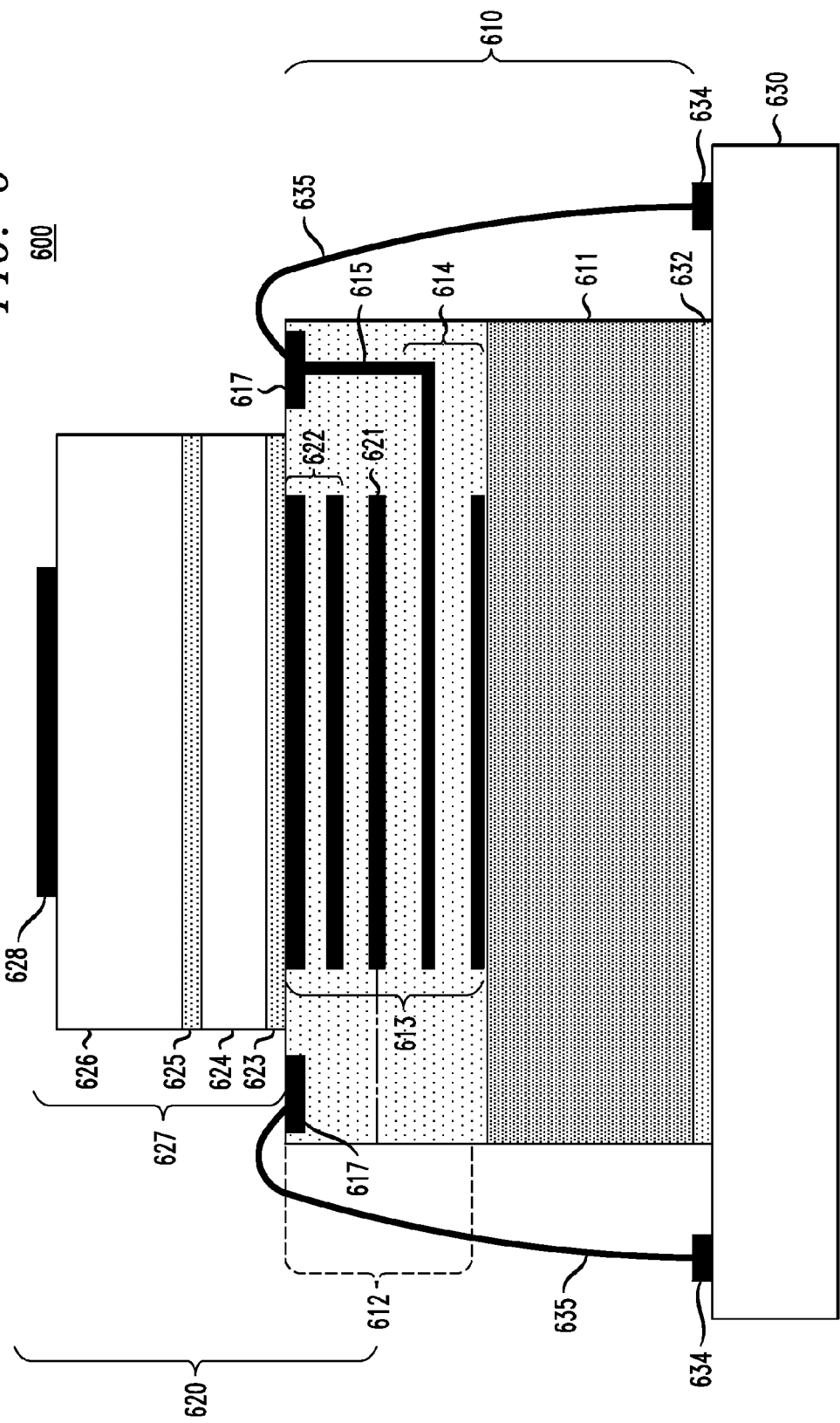
FIG. 6 schematically depicts an RFIC package comprising an integrated antenna structure according to another embodiment of the invention.

In another embodiment of the invention, when a TSV process is not utilized, a superstrate structure can be manufactured separately from an RFIC package with an on-chip antenna, and the two package components can be bonded together in a separate process, and then mounted to an application board with bonding wires, as depicted in FIG. 6. In particular, FIG. 6 schematically depicts an RFIC package 600 comprising an RFIC chip 610 and a superstrate structure 627 that is manufactured separately from the RFIC chip 610 and then subsequently bonded to the RFIC chip 610 using an adhesive material 623. FIG. 6 illustrates an exemplary embodiment in which the footprint sizes of the RFIC chip 610 and the antenna superstrate structure 627 are different, allowing for a different approach to packaging and wiring. In particular, as shown in FIG. 6, the footprint size of the RFIC chip 610 is greater than the footprint size of the antenna superstrate structure 627, thereby allowing low frequency wire bonds 635 to be attached to contact pads 617 exposed in a peripheral region of the top surface of a BEOL structure 612 of the RFIC chip 610 and to contact pads 634 on a top surface of an application board 630.

The RFIC chip 610 shown in FIG. 6 comprises a semiconductor substrate 611 (e.g., silicon substrate) and a BEOL structure 612 formed on an active surface of the semiconductor substrate 611. The BEOL structure 612 comprises a plurality of alternating dielectric/insulating layers and patterned metallic layers 613, vertical interconnects 615, and upper contact pads 617 exposed on an upper surface of the BEOL structure 612. The vertical interconnect 615 comprises a plurality of aligned conductive vias formed through multiple insulating/dielectric layers of the BEOL structure 612. The vertical interconnect 615 connects one or more patterned metal layers 614 of the BEOL layers 613 to the contact pads 617.

In the embodiment of FIG. 6, an antenna structure 620 comprises on chip antenna structure formed as part of the upper metal layers 621, 622 of the BEOL layers 613, and the superstrate structure 627. The superstrate structure 627 comprises a first substrate layer 624 bonded to the BEOL structure 612 using the adhesive layer 623, a second substrate layer 626 bonded to the first substrate layer 624 using an adhesive layer 625, and a complementary focusing metal element 628 disposed on top of the second substrate layer 626. In one embodiment of the invention, the superstrate structure 627 shown in FIG. 6 is similar in structure and composition to the superstrate structure 127 shown in FIGS. 1 and 5 for example, except that the superstrate structure 627 has a smaller footprint than the RFIC chip 610 to thereby expose the contact pads 617 formed in the peripheral upper surface region of the BEOL structure 612. In this embodiment, the wire bonds 635 are implemented to provide electrical connections between the contact pads 617 of the RFIC chip 610 and the contact pads 634 on the application board 630, which allows direct DC supply and/or control and I/O baseband signal connections between the RFIC chip 610 and other components or package structures or systems connected to the application board 630. The RFIC chip 610 is bonded to the application board 630 using an adhesive layer 632.

Those of ordinary skill in the art will readily appreciate the various advantages associated with integrated chip/antenna package structures according to embodiments of the invention. For instance, the exemplary package structure can be readily fabricated using known wafer-scale manufacturing and packaging techniques to fabricate and package antenna structures with semiconductor RFIC chips to form compact integrated radio/wireless communications systems for millimeter-wave and Terahertz applications. Moreover, integrated chip packages according to exemplary embodiments of the invention enable antennas to be integrally packaged with IC chips such as transceiver chips, which provide compact designs with very low loss between the transceiver and the antenna. Various types of antenna designs can be implemented including patch antennas, slot antennas, slot ring antennas, dipole antennas, and cavity antennas, for example. Moreover, the use of integrated antenna/IC chip packages according to the present invention saves significant space, size, cost, and weight, which is a premium for virtually any commercial or military application.

Although exemplary embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. A package structure, comprising:
an RFIC (radio frequency integrated circuit) chip comprising a semiconductor substrate having an active surface and an inactive surface, and a BEOL (back end of line) structure formed on the active surface of the semiconductor substrate; and
an antenna structure comprising:
a planar antenna having one or more radiator elements formed as part of the BEOL structure of the RFIC chip; and
a superstrate structure disposed on a surface of the BEOL structure adjacent planar antenna, the superstrate structure comprising at least one substrate layer and a focusing metal element disposed on a surface of the at least one substrate and aligned to the one or more radiator elements of the planar antenna, wherein the focusing metal element has a structure that is complementary to the one or more radiator elements of the planar antenna and configured to focus electromagnetic radiation to and from the planar antenna structure.

2. The package structure of claim 1, wherein the at least one substrate of the superstrate structure is formed of a low loss semiconductor material.

3. The package structure of claim 2, wherein the low loss semiconductor material comprises high resistivity silicon, silica, quartz, or borofloat.

4. The package structure of claim 1, wherein the at least one substrate of the superstrate structure is formed of a low loss glass material.

5. The package structure of claim 1, wherein a total thickness of the at least one substrate layer of the superstrate structure is less than ¼ wavelength of an operating frequency of the planar antenna.

6. The package structure of claim 1, wherein the at least one substrate layer of the superstrate structure comprises a first substrate layer and a second substrate layer, wherein the focusing metal element is disposed on a surface of the second substrate layer and the first substrate layer is disposed between the BEOL structure and the second substrate layer.

7. The package structure of claim 6, wherein the first substrate layer is formed on high resistivity silicon, and wherein the second substrate layer is formed of borofloat.

8. The package structure of claim 1, wherein the planar antenna comprises a planar rectangular patch radiator element, and wherein the focusing metal element of the superstrate structure comprises a planar rectangular structure with a rectangular cutout feature that is aligned to the planar rectangular patch radiator element.

9. The package structure of claim 8, wherein the rectangular cutout feature of the focusing metal element is larger an area of the planar rectangular patch radiator element.

10. The package structure of claim 1, wherein the planar antenna comprises a planar rectangular fractal-patch radiator element, and wherein the focusing metal element of the superstrate structure comprises a planar rectangular structure with a rectangular cutout feature that is aligned to the planar rectangular fractal patch radiator element.

11. The package structure of claim 10, wherein the rectangular cutout feature of the focusing metal element is larger in area that an area of the planar rectangular fractal-patch radiator element.

12. The package structure of claim 1, wherein a footprint of the superstrate structure is smaller than a footprint of the RFIC chip.

13. The package structure of claim 1, wherein the superstrate structure and the RFIC chip have substantially a same size footprint.

14. The package structure of claim 1, further comprising an antenna feed line formed as part of the BEOL structure of the RFIC chip.

15. The package structure of claim 1, further comprising an antenna ground plane formed as part of the BEOL structure of the RFIC chip.

16. An apparatus, comprising;
an RFIC (radio frequency integrated circuit) chip comprising a semiconductor substrate having an active surface and an inactive surface, and a BEOL (back end of line) structure formed on the active surface of the semiconductor substrate; and
an antenna structure comprising:
a planar antenna having one or more radiator elements formed as part of the BEOL structure of the RFIC chip; and
a superstrate structure disposed on a surface of the BEOL structure adjacent planar antenna, the superstrate structure comprising at least one substrate layer and a focusing metal element disposed on a surface of the at least one substrate and aligned to the one or more radiator elements of the planar antenna, wherein the focusing metal element has a structure that is complementary to the one or more radiator elements of the planar antenna and configured to focus electromagnetic radiation to and from the planar antenna structure
a circuit board, wherein the RFIC chip is mounted to the circuit board; and
electrical interconnect structures providing DC supply, ground, control and I/O baseband signal lines between the RFIC chip and the circuit board.

17. The apparatus of claim 16, wherein a footprint of the superstrate structure is smaller than a footprint of the RFIC chip, and wherein the electrical interconnect structures comprise:
contact pads formed as part of the BEOL structure and exposed on a peripheral surface region of the BEOL structure;
contact pads formed on the surface of the circuit board;
wire bonds formed between contacts pads on the surface of the BEOL structure and the circuit board; and
conductive vias and metal traces formed in the BEOL structure connecting the contact pads on the surface of the BEOL structure to one or more metal layers of the BEOL structure.

18. The apparatus of claim 16, wherein the superstrate structure and the RFIC chip have substantially a same size footprint, and wherein the electrical interconnect structures comprise:
conductive vias that are formed through the semiconductor substrate of the RFIC chip from the active surface to the inactive surface; and
contact pads on the inactive surface of the semiconductor subset of the RFIC chip forming electrical bonds to contact pads on the circuit board.

19. The apparatus of claim 16, wherein the superstrate structure is fabricated separately from the RFIC chip and bonded to the BEOL structure of the RFIC chip.

20. The apparatus of claim 16, wherein the superstrate structure is fabricated as part of a fabrication process of the RFIC chip using wafer scale fabrication.

21. The apparatus of claim 16, wherein the at least one substrate of the superstrate structure is formed of a low loss semiconductor material.

22. The apparatus of claim 21, wherein the low loss semiconductor material comprises high resistivity silicon, silica, or quartz.

23. The apparatus of claim 16, wherein the at least one substrate of the superstrate structure is formed of a low loss glass material.

24. The apparatus of claim 16, wherein a total thickness of the at least one substrate layer of the superstrate structure is less than ¼ wavelength of an operating frequency of the planar antenna.

25. The apparatus of claim 16, wherein the at least one substrate layer of the superstrate structure comprises a first substrate layer and a second substrate layer, wherein the focusing metal element is disposed on a surface of the second substrate layer and the first substrate layer is disposed between the BEOL structure and the second substrate layer.

26. The apparatus of claim 25, wherein the first substrate layer is formed of high resistivity silicon and wherein the second substrate layer is formed of borofloat.

27. The apparatus of claim 16, wherein the planar antenna comprises a planar rectangular patch radiator element, and wherein the focusing metal element of the superstrate structure comprises a planar rectangular structure with a rectangular cutout feature that is aligned to the planar rectangular patch radiator element.

28. The apparatus of claim 27, wherein the rectangular cutout feature of the focusing metal element is larger in area than an area of the planar rectangular patch radiator element.

29. The apparatus of claim 16, wherein the planar antenna comprises a planar rectangular fractal-patch radiator element, and wherein the focusing metal element of the superstrate structure comprises a planar rectangular structure with a rectangular cutout feature that is aligned to the planar rectangular fractal patch radiator element.

30. The apparatus of claim 29, wherein the rectangular cutout feature of the focusing metal element is larger in area that an area of the planar rectangular fractal-patch radiator element.

* * * * *